(12) United States Patent
Schatzberger (10) Patent No.: US 9,362,922 B2
(45) Date of Patent: Jun. 7, 2016

(54) OSCILLATOR CIRCUIT AND METHOD FOR GENERATING AN OSCILLATOR SIGNAL

(71) Applicant: ams AG, Unterpremstaetten (AT)

(72) Inventor: Gregor Schatzberger, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/420,336

(22) PCT Filed: Aug. 8, 2013

(86) PCT No.: PCT/EP2013/066650
§ 371 (c)(1),
(2) Date: Feb. 6, 2015

(87) PCT Pub. No.: WO2014/023806
PCT Pub. Date: Feb. 13, 2014

(65) Prior Publication Data
US 2015/0222272 A1    Aug. 6, 2015

(30) Foreign Application Priority Data

Aug. 9, 2012   (EP) .................................... 12179948

(51) Int. Cl.
*H03K 3/26* (2006.01)
*H03L 1/02* (2006.01)
*H03K 3/0231* (2006.01)
*H03K 4/502* (2006.01)

(52) U.S. Cl.
CPC ................ *H03L 1/02* (2013.01); *H03K 3/0231* (2013.01); *H03K 4/502* (2013.01)

(58) Field of Classification Search
CPC ..................................................... H03K 3/0231
USPC .................. 331/111, 143, 176; 327/131, 132
See application file for complete search history.

(56) References Cited

U.S. PATENT DOCUMENTS

| | | |
|---|---|---|
| 5,912,593 A | 6/1999 | Susak et al. |
| 6,356,161 B1 | 3/2002 | Nolan et al. |
| 6,646,513 B1 | 11/2003 | Neidorff |
| 6,867,657 B2 | 3/2005 | Hollinger et al. |
| 7,474,163 B1 | 1/2009 | Wile et al. |
| 7,944,315 B2 | 5/2011 | Lin |
| 8,198,947 B2 | 6/2012 | Schatzberger |
| 8,508,307 B2 * | 8/2013 | Mitsuda et al. ............... 331/176 |
| 2007/0182495 A1 | 8/2007 | Lall |
| 2007/0182499 A1 | 8/2007 | Wakai et al. |
| 2010/0327985 A1 | 12/2010 | Schatzberger |
| 2012/0194279 A1 | 8/2012 | Nonis et al. |

* cited by examiner

*Primary Examiner* — Arnold Kinkead
(74) *Attorney, Agent, or Firm* — McDermott Will & Emery LLP (57) ABSTRACT

The present invention relates to an oscillator circuit, comprising a switched capacitor circuit comprising a parallel circuit with a current input to be supplied with a reference current on one side and being connected to a reference terminal on the other side. The parallel circuit further comprises a first capacitor in a first branch and, in a second branch, a second capacitor connected in-between a first and second switch. A switch control unit comprises a first input coupled to the current input of the parallel circuit and a second input to be supplied with a reference voltage as well as an oscillator output for providing an oscillator signal. The switch control unit is being designed to operate the first and second switch such that, in a charging phase, the first and second capacitor is charged to a respective level depending on the reference voltage and, in a discharging phase, the charge stored on the first capacitor is discharged using the charge stored on the second capacitor.

14 Claims, 6 Drawing Sheets

OSCILLATOR CIRCUIT AND METHOD FOR GENERATING AN OSCILLATOR SIGNAL

BACKGROUND OF THE INVENTION

The present invention relates to an oscillator circuit and to a method for generating an oscillator signal.

Oscillators are playing a key role in integrated circuit design. Almost every digital core needs some sort of clock generator to enable the operation of the circuit. There are many different possibilities to design an oscillator known in the art. The most precise oscillator is built up with quartz. The drawbacks of quartz oscillators, however, include limited temperature range from −40° to 125° C. and that quartz is an expensive external component which cannot be easily integrated, e.g. into the same silicon chip as the rest of the circuit.

Many applications, however, need an extended temperature range which may span −40° to 170° C. Furthermore, external components such as quartz are expensive and lead to rather high production costs. There are some designs known in the art to implement fully integrated CMOS oscillators. Such circuits are often required to combine low temperature drift of output frequency, low power consumption, low clock jitter, good power supply rejection ratio, low voltage ripple on the power supply, low charge injection in the substrate and small area.

SUMMARY OF THE INVENTION

According to one aspect of the invention, an oscillator circuit comprises a switched capacitor circuit and a switch control unit. The switched capacitor circuit comprises a parallel circuit with a current input to be supplied with a reference current on one side and being connected to a reference terminal on the other side. The parallel circuit further comprises a first capacitor in a first branch and, in a second branch, a second capacitor connected in between a first and a second switch. The switch control unit comprises a first input coupled to the current input of the parallel circuit as well as a second input to be supplied with a reference voltage. Furthermore, the switch control unit also comprises an oscillator output for providing an oscillator signal.

The switch control unit is designed to operate the first and second switch such that, in a charging phase, the first and second capacitors are charged to a respective level depending on the reference voltage. In a discharging phase, the charge stored on the first capacitor is discharged using the charge stored on the second capacitor.

The oscillator circuit is operated in the charging and discharging phase. Preferably, these two phases are consecutive, i.e. following one after the other. The sequence of charging and discharging phase can be repeated in cycles effectively defining a periodic the oscillator signal. In particular, in the charging phase the switch control unit operates the first and second switch such that the first and second capacitors are charged with the reference current to a respective level. This level depends on the reference voltage applied to the oscillator circuit. Both reference current and reference voltage preferably are generated by a respective reference generator, e.g. a band gab generator. Said reference generator can either be externally connected to the oscillator circuit and be an integral part of it.

Once the respective level of charge of the capacitors is reached, the switch control unit switches the first and second switch and thereby initiates the discharging phase. In fact, the switches lead to discharging the charge stored on the first capacitor using the charge stored on the second capacitor. The discharging of the first capacitor leads to a voltage drop which is apparent at the first input of the switch control unit. Depending on the relative capacities of the first and second capacitor the voltage over the first capacitor may even drop down to essentially zero voltage. Reaching this voltage level over the first capacitor characterizes the end of the discharging phase. Another charging phase can now follow, effectively defining a new cycle.

An oscillator circuit implemented according to the above-described principle features rather low power consumption and small area as a switching control unit can be implemented with rather non-complex components like comparators and logics. Furthermore, temperature drift has no major impact as possibly mismatching of current sources is not an issue as only one current source is needed to implement the oscillator circuit, i.e. current from the reference generator. Furthermore, temperature drift often caused by switching between current sources loading the capacitors is also not an issue because the first capacitor is continuously loaded. This also results in smaller current spikes on the power supply compared to prior art solutions. There also is no need for a second reference voltage because both capacitors are charged effectively to the same level depending on their respective capacities and subtracting or discharging the charges leads to almost zero voltage on the first input of the switching control unit. Even a possible mismatch of the capacitors has little influence because the resulting voltages are small and could easily be handled by a unipolar CMOS circuit. Good power supply rejection ratio is achieved as cascaded structures need not be used in current source and switching control unit. There is also no need for an overlapping wave form generator because unwanted discharging of the capacitors affects both capacitors in the same way, i.e. changes in the absolute value of the oscillator frequency can be trimmed out. Furthermore, the input of the comparator is not switched and therefore unwanted triggering of the switch control unit can be prevented.

According to another aspect of the invention the oscillator circuit further comprises a reference generator to generate the reference current and to generate the reference voltage. In particular, a reference current output is coupled to the current input of the parallel circuit in order to supply the reference current. A reference voltage output is coupled to the second input of the switch control unit.

According to another aspect of the invention, the reference generator is a temperature compensated reference generator. Preferably, the temperature compensated reference generator is a band gap reference generator. Thus, the reference generator provides the reference current and reference voltage stable over temperature variations. An extended temperature range which may span −40° to 170° C. is feasible.

According to another aspect of the invention, the reference current output of the reference generator is connected to an input side of a load current generator. An output side of the load current generator is connected to the current input of the parallel circuit. Preferably, the load current generator adjusts the reference current to better meet given requirements. Requirements may comprise scaling of the reference current, account for process variations of capacitors and other components and adjusting the oscillator signal in amplitude and/or frequency.

According to another aspect of the invention, the load current generator comprises at least one trimming input to trim the reference current and provide a trimmed reference current at the current input. By trimming the reference current the oscillator circuit does not need a non-overlapping waveform generator because unwanted discharging of the first and second capacitors affects both capacitors in the same way and a change in absolute value of the frequency of the oscillator signal can be trimmed out.

According to another aspect of the invention, the first and second capacitors have the same capacity. The term "same capacity" includes the usual fabrication uncertainties and the capacity of first and second capacitor are considered to be the same within these uncertainties. Preferably, the capacitors are also matched to each other with respect to material, area and temperature properties. In this way, by discharging the charge stored on the first capacitor using the charge stored on the second capacitor, leads to almost zero voltage over the first capacitor during the discharging phase.

According to another aspect of the invention, the switch control unit comprises a comparator comprising the first and second input and further comprising an output to provide a control signal.

In the proposed oscillator circuit power consumption is rather low as the above-mentioned comparator can be used in a quite simple design. Due to the same reason, the oscillator circuit can be integrated into a rather small area. In fact, both first and second inputs are not switched between the first and second capacitors and the oscillator circuit design allows for two inputs to the comparator only. Multiple input comparators having a respective input for each capacitor would otherwise demand bigger area in an integrated circuit design. Using different inputs and correspondingly a more complex comparator structure for each of the two capacitors is not necessary. Using a rather basic comparator structure has a positive impact on both power consumption and area of implementation.

According to another aspect of the invention, the first input of the comparator is electrically connected to the current input in both charging and discharging phase. In other words, the same comparator is used to measure the voltage of the capacitors in both charging and discharging phase. During the two phases the voltage applied to the first input of the comparator changes as a function of the charge stored on the first capacitor defining the oscillator signal as function of time. The first capacitor on the other hand is continuously loaded during both charging and discharging phase and there is no switching between capacitors. Temperature drift can be considerably reduced which could otherwise result from switching different current sources onto the first input of the comparator.

According to another aspect of the invention, the switch control unit comprises a flip-flop. The flip-flop has a first flip-flop input which is connected to the output of the comparator. A first flip-flop output is connected to the oscillator output for providing the oscillator signal.

The comparator outputs a control signal which is provided to the first flip-flop input and internally sets logical conditions from which the switching of switches is derived. Depending on the control signal the oscillator signal is generated. For example, the oscillator signal may be a rectangular function having a high state and a low state. The levels of the states could be defined by supply voltages of the flip-flop.

According to another aspect of the invention, the first flip-flop output is coupled to the first and second switch. The flip-flop outputs the oscillator signal via the flip-flop output. The oscillator can also be used as a control signal to operate the first and second switch. For example, the switches can be forced to open and close depending on a high or low state of the oscillator signal, respectively. By operating the first and second switch the flip-flop initiates both the charging and discharging phase.

According to another aspect of the invention, the oscillator circuit comprises a third switch which is grounded and is coupled to the second capacitor. During a reset phase, the first and second capacitors are set to a ground potential to equalize their respective charges. Furthermore, the third grounded switch is operated by the switch control unit depending on a reset signal to be applied.

According to an aspect of the invention, a method for generating an oscillator signal comprises generating a reference current and a reference voltage. In a charging phase, a first and a second capacitor are charged in parallel with the reference current. The first and second capacitors are charged to a respective level depending on the reference voltage.

In a discharging phase, the charge stored on the first capacitor is discharged using the charge stored on the second capacitor. Finally, an oscillator signal is generated depending on the charge stored on the first capacitor. As the charge stored on the first capacitor is changing over time by consecutive charging and discharging, the oscillator signal depends on the temporal succession of charging and discharging phase.

The proposed method for generating an oscillator signal is advantageous in rather low power consumption and small area requirement as rather non-complex components like comparators and logics can be used to perform its procedural steps. Furthermore, temperature drift has only little impact as current can be generated from a single current source. Furthermore, temperature drift often caused by switching between current sources loading the capacitors is also not an issue because the first capacitor can be continuously loaded. This also results in smaller current spikes on the power supply compared to prior art solutions. There also is no need for a second reference voltage because both capacitors are charged effectively to the same level depending on their respective capacities and subtracting or discharging the charges leads to almost zero voltage. Even a possible mismatch of the capacitors has little influence because the resulting voltages would be small and thus could easily be handled by CMOS circuitry. Good power supply rejection ratio can be achieved as there is no need to implement cascaded structures. There is also no need for an overlapping wave form generation because unwanted discharging of the capacitors affects both capacitors in the same way, i.e. changes in the absolute value of the oscillator frequency can be trimmed out. Furthermore, the input of the comparator is not switched and therefore unwanted triggers can be prevented.

According to another aspect of the invention, the first capacitor is charged with a reference current during both the charging and discharging phase. Such continuous loading without switching between capacitors allows for reducing impact of temperature drift, unwanted triggering and discharging of the capacitors. Both capacitors are essentially affected in the same way.

According to another aspect of the invention, the reference current and the reference voltage are provided in a temperature compensated manner. This way the oscillator signal is stable over temperature wherein the temperature range basically is defined by the way reference current and the reference voltage is generated. An extended temperature range which may span −40° to 170° C. is feasible.

According to another aspect of the invention, an oscillation period of the oscillator signal results from the succession of a charging phase and discharging phase. The oscillator signal is then generated by at least one cycle of succeeding charging phase and discharging phase.

Generally it is preferred the capacitors had similar or equal capacities and are matched in terms of other parameters like area and thermal properties. The charging and discharging phase then has similar or equal duration in time. One cycle of charging phase followed by discharging phase defines one period of the oscillator signal.

In the following, the principle presented above is described in further detail by means of drawings in which exemplary embodiments are presented. Like reference numerals designate corresponding similar parts or elements.

DETAILED DESCRIPTION

Figure 1:
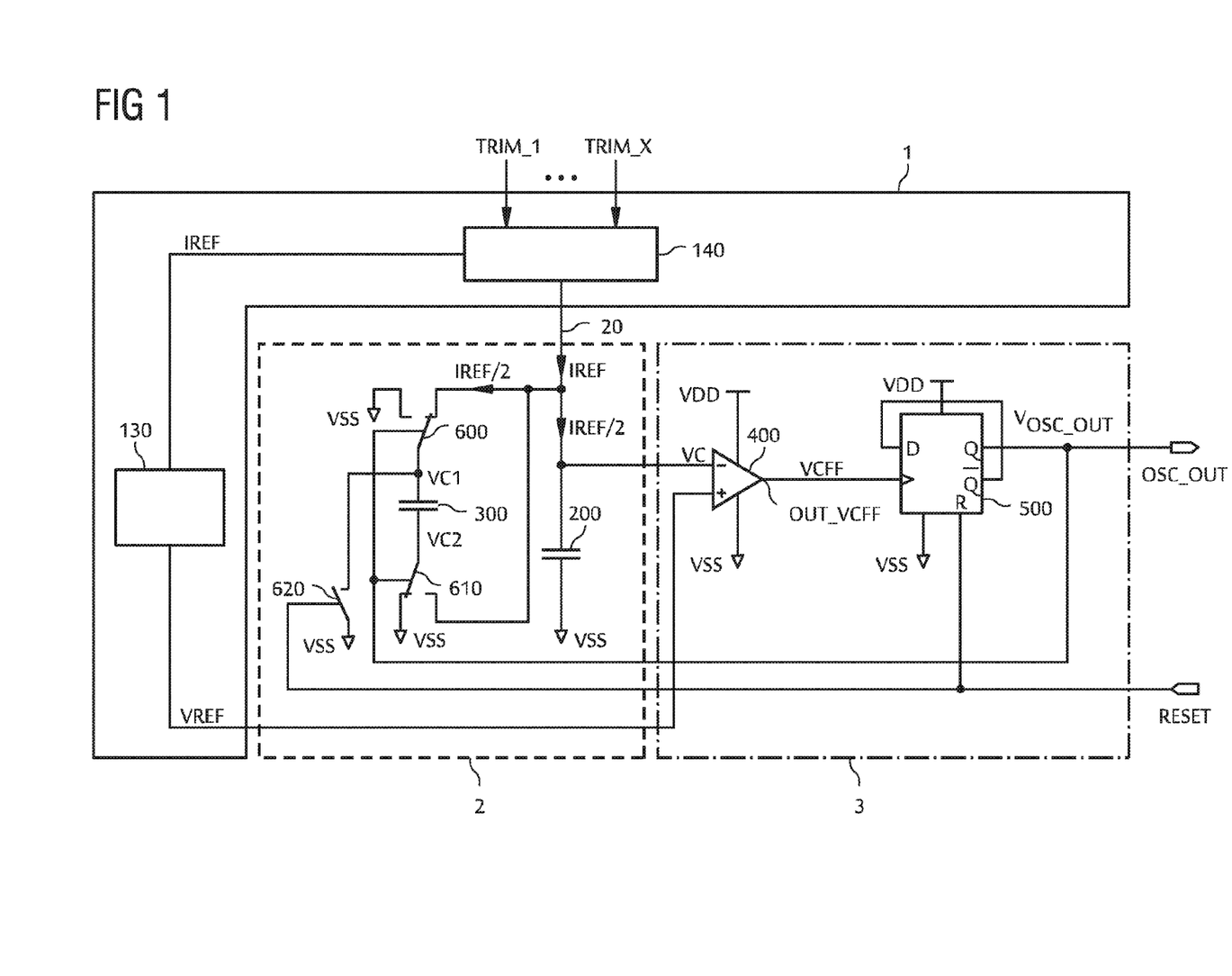
FIG. 1 shows an exemplary embodiment of an oscillator circuit according to the present principle.

FIG. 1 shows an exemplary embodiment of an oscillator circuit according to the present principle. This exemplary oscillator circuit comprises three functional blocks: a reference arrangement 1, a switched capacitor circuit 2 and a switch control unit 3. The circuit discussed below can be integrated as an integrated circuit.

The reference arrangement 1 further comprises a reference generator 130. In this exemplary embodiment reference generator 130 is a temperature compensated reference generator, e.g. a bandgap reference generator (see FIGS. 4 and 5 for further details). Basically, reference generator 130 outputs a reference current IREF at one output and a reference voltage VREF at another output.

The reference generator arrangement 1 further comprises a load current generator 140. The load current generator 140 receives at one input the reference current IREF generated by the reference generator 130. The load current generator 140 comprises several trimming inputs TRIM_1, ..., TRIM_X to trim the reference current IREF (see FIG. 6 for further details). Generally, the load current generator 140 outputs a trimmed reference current IREF' to be provided at a current input 20 of the switched capacitor circuit 2.

The switch capacitor circuit 2 comprises a parallel circuit having a first and a second branch. The first branch comprises a first capacitor 200 which is further connected to a reference potential VSS. The second branch comprises a second capacitor 300 which is connected in series with a switch 600 and via a first circuit node VC1 and via a second circuit node VC2 to a second switch 610 coupled to a reference terminal VSS. The first and second switch 600, 610 can both be switched to the reference terminal VSS or, alternatively, to current input 20. The first circuit node VC1 is further connected to a third switch 620 which is connected to the reference potential VSS. The third switch 620 is coupled via a control line to the switch control unit 3.

The switch control unit 3 further comprises a comparator 400 and a flip-flop 500. The comparator 400 is supplied via a supply terminal VDD and another reference terminal VSS. A first input − of the comparator is connected to the current input 20. A second input + of comparator 400 is connected to the reference generator 130 to receive the reference voltage VREF. An output VCFF of the comparator 400 is connected to a first flip-flop input > of flip-flop 500. In this particular embodiment the flip-flop constitutes a D-Q flip-flop structure. However, this structure is not limited and other structures can be implemented as well. A D input of flip-flop 500 is connected to an inverted Q output and a Q output of flip-flop 500 is connected to an oscillator output OSC_OUT. The Q output of flip-flop 500 is further connected via control lines to the first and second switches 600, 610. A reset output R of flip-flop 500 is both connected to a reset input RESET of the oscillator circuit and via a control line connected to the third switch 620.

Figure 2:
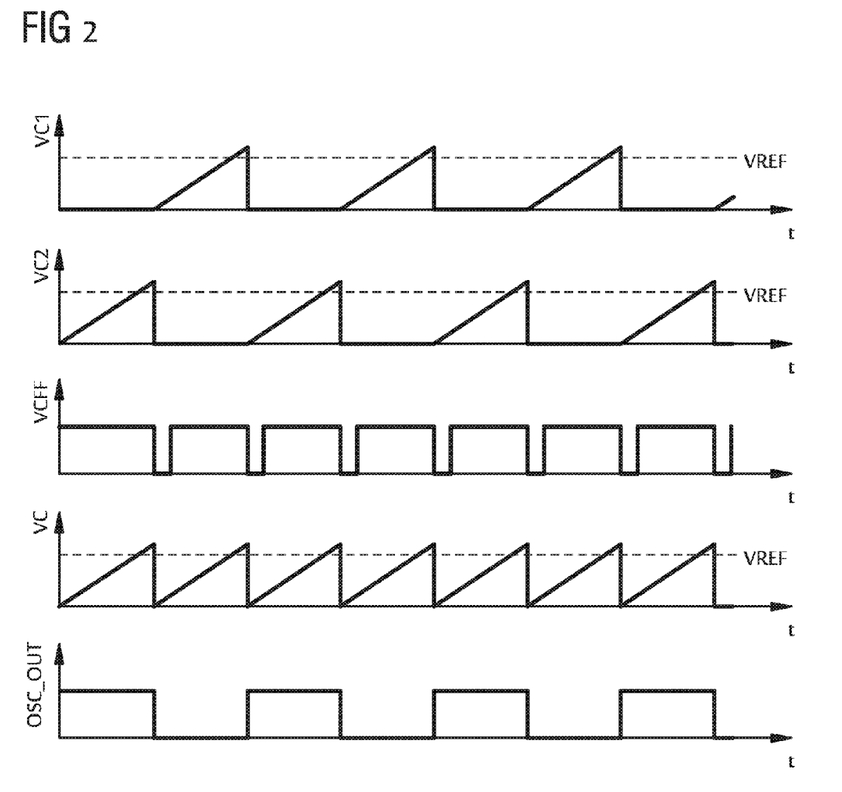
FIG. 2 shows an exemplary timing diagram of an oscillator circuit according to the present principle.

The principle of operation of the present exemplary embodiment of the oscillator circuit will now be described with reference to FIG. 2. FIG. 2 shows a timing diagram of the exemplary oscillator circuit according to FIG. 1. The timing diagram shows the voltages at the first and second circuit nodes VC1, VC2 as a function of time t. Furthermore, the diagram also shows the voltage at the comparator output VCFF, and the comparator input VC as a function of time t. Finally, the oscillator signal OSC_OUT is also shown as a function of time.

Typically, before starting the operation of the oscillator circuit a starting condition at the circuit is set in a reset phase by applying a reset signal at reset input RESET. For example, connecting the reset input to a positive power supply (e.g. via supply terminal VDD) closes the third switch 620 and discharges the second capacitor 300. At the same time, also via third switch 620, the first capacitor 200 is grounded and discharged. The reset phase may be initiated by the flip-flop 500 by driving the reset input R to via terminal VDD and forcing oscillator output OSC_OUT to a ground potential via terminal VSS. Connecting the reset input RESET to ground potential opens the third switch 620 and clears the R input on flip-flop 500 and thus releases the oscillator for operation.

From such adjusted initial condition, the oscillator circuit starts operation first in a charging followed by a first discharging phase. Via the second switch 610, a ground plate of the second capacitor 300 is connected to ground terminal VSS. At the same, the first switch 600 connects a top plate of the second capacitor 300 to the current input 20. In this state the reference current IREF starts to load both the first and second capacitor 200, 300 in parallel. This can be seen from FIG. 2 as a signal rise at the second circuit node VC2, as well as at the first comparator input—which is supplied with voltage VC. As the capacitance values in the exemplary embodiment of the two capacitors are set to be equal, both capacitors are loaded with half the reference current, i.e. IREF'/2.

The charging of capacitors 200, 300 stops if the voltage level VC at the comparator input − becomes higher than the reference voltage VREF supplied by the reference generator 130. This condition is also indicated in the drawing by a horizontal line with reference numeral VREF. The comparator 400 detects this event and triggers the discharging phase following the charging phase. An output signal VCFF of the comparator is triggering the flip-flop 500 and changes its logic state as imprinted on the oscillator OSC_OUT to change from voltage at terminal VSS to voltage at terminal VDD. Correspondingly, the switch 610 changes its state and connects a bottom plate of the second capacitor 300 to current input 20. At the same time the first switch 600 switches a top plate of the second capacitor 300 to VSS.

As a consequence, the charge already stored on the second capacitor 300 is subtracted from the corresponding charge from the first capacitor 200. As in this exemplary embodiment both capacitors are of the same capacitance, the voltage at the comparator input – drops to 0 V as also clearly indicated in the drawing (see first and second circuit node VC1, VC2 and voltage VC at the comparator input –). Again this condition is detected by the comparator 400 and effectively terminates the discharging phase to start a new integration cycle, i.e. starting a new charging phase.

In this following charging phase first and second capacitors are charged again until the voltage VC at the comparator input – becomes higher than the reference voltage VREF. The oscillator output signal OSC_OUT is derived from the change of charging and discharging phase with oscillation period T.

The absolute value of the output frequency depends on the value of the reference voltage VREF, the reference current IREF and the capacitance values of capacitors 200, 300. Trimming the reference current IREF reduces process variations of the capacitors, reference voltage and enables a correct setting of the output frequency. Further details of the trimming are subject of FIG. 6.

The reference generator 130 generates a temperature-stable reference voltage and a temperature-stable reference current. The reference voltage VREF can be generated by a bandgap reference circuit as will be described in further detail with respect to FIGS. 4 and 5.

Figure 3:
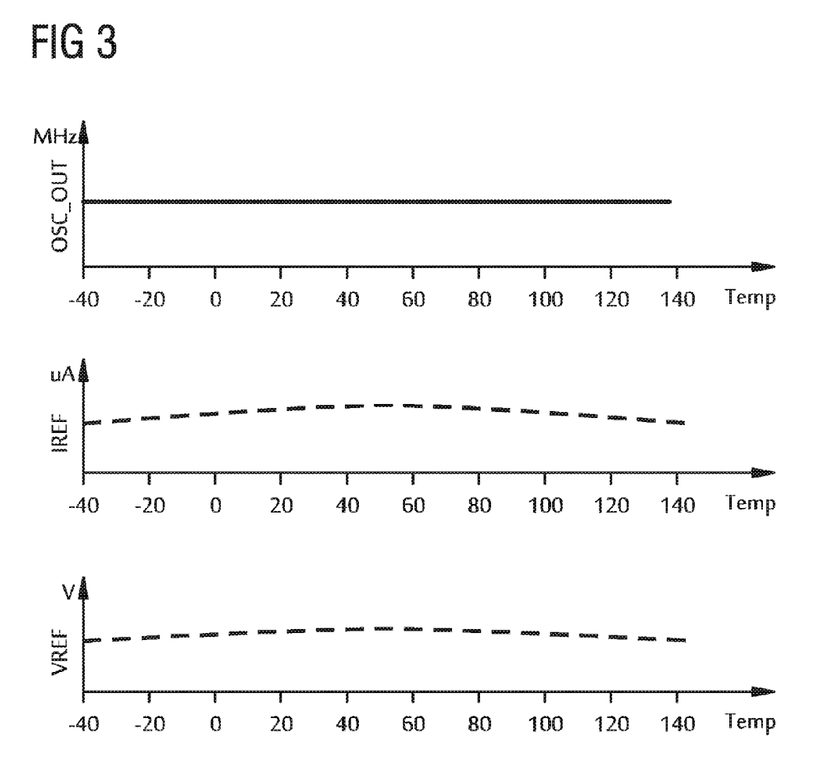
FIG. 3 shows an exemplary correlation diagram of reference voltage, reference current and output frequency over temperature characterizing an oscillator circuit according to the present principle.

FIG. 3 shows signal diagrams of the reference voltage, VREF_OSC, the reference current IREF and the frequency of the output signal OSC_OUT as a function of the operating temperature.

A load time of a capacitor in the first order of c is stable over a wide temperature range and the ratio of reference voltage over reference current cancels the temperature drift of VREF and IREF. For example, the reference voltage VREF and the reference current IREF are temperature-dependent only to a first approximation. The reference current and the reference voltage have an influence on the charging time of the capacitors C1, C2 to an equal extent. They show similar temperature behaviour which cancel out so that the output frequency of the clock signal is substantially temperature-independent. In fact, the load t_load of both capacitors is defined as $$\text{t\_load} = \frac{(C \cdot VREF)}{IREF'/2},$$

wherein C denotes the capacitance of either first or second capacitor. As depicted in the drawing C is, in first order, constant over a temperature (here: –40° to 150° C.) and the ratio VREF/IREF' cancels the temperature drift apparent from FIG. 3. Thus, in the first order the load time t_load is also temperature-stable. Designing the comparator 400 with a constant propagation delay over temperature thus leads to a temperature-stable output frequency of the oscillator signal OSC_OUT.

Figure 4:
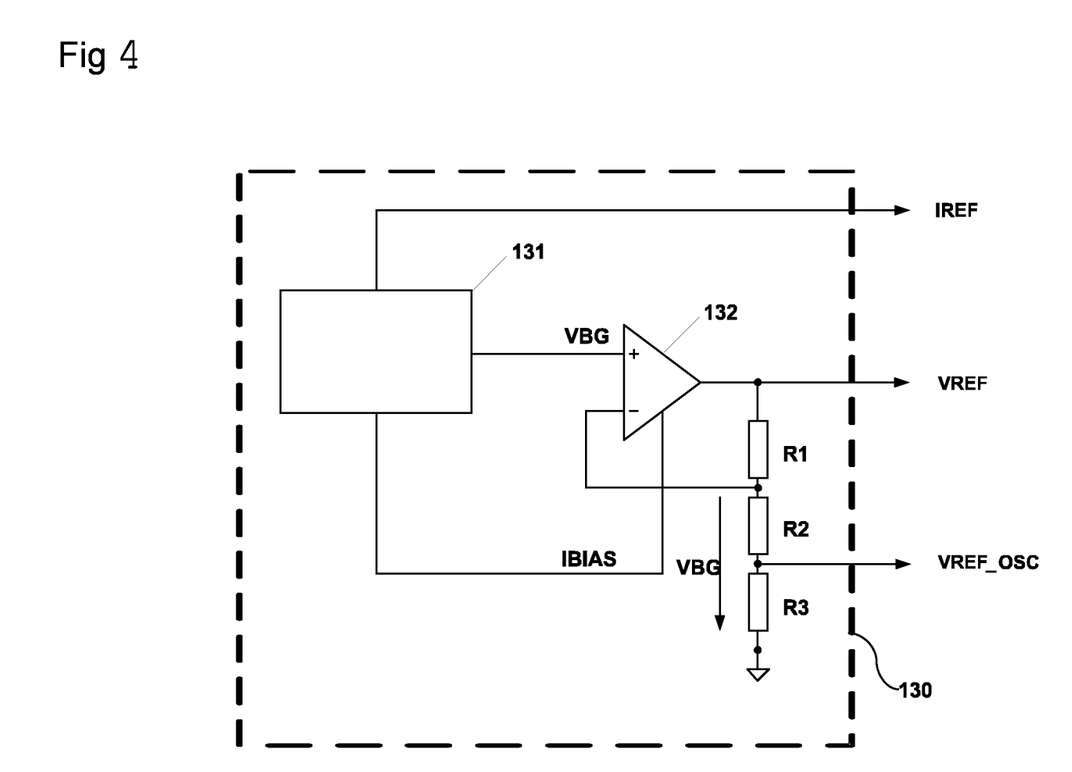
FIG. 4 shows an exemplary embodiment of a reference generator.

FIG. 4 shows an exemplary embodiment of a reference generator 130 designed based on a bandgap circuit, which comprises a current and voltage generation block 131, an operational amplifier 132 and resistors R1, R2, R3.

The voltage generation block 131 serves to generate a temperature-stable reference voltage VBG, which can also be referred to as a bandgap voltage and to generate the temperature-compensated reference current IREF. The bandgap voltage VBG is supplied to a non-inverting input of the operational amplifier 132. The output of the operational amplifier 132 is coupled to the reference potential terminal via a series circuit of the resistors R1, R2, R3, wherein a connection node R1, R2 of the resistors is connected to the inverting input of the operational amplifier 132. A bias current IBIAS for supplying the operational amplifier 132 is likewise provided by the circuit block 131 and is preferably temperature-compensated.

In the operation of the reference generator, the bandgap voltage VBG settles in as the voltage drop across the resistors R2, R3. This has the effect that an additional reference voltage VREF', which can be used elsewhere in separate parts of the oscillator circuit, is higher than the bandgap voltage VBG. The reference voltage VREF, which is smaller than the bandgap voltage due to the voltage divider of the resistors R2, R3, is tapped at the connecting node of the resistors R2, R3. Since the value range of the bandgap voltage VBG is technologically limited, shorter charging times and thus higher frequencies for the oscillator signal OSC_OUT can be generated by the smaller reference voltage VREF. Alternatively or additionally, smaller charging currents can be used to charge the capacitors reducing the power consumption of the oscillator circuit.

Figure 5:
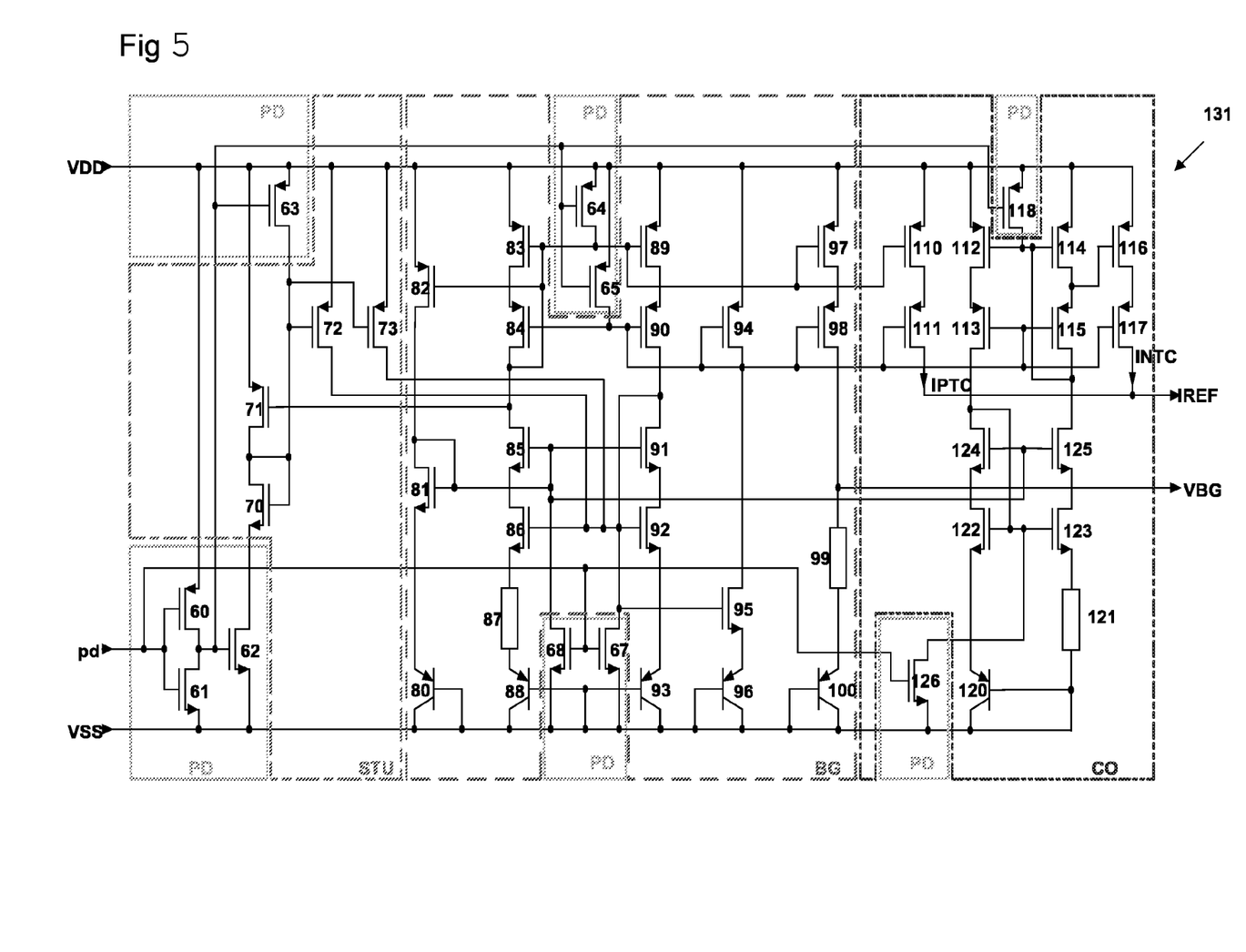
FIG. 5 shows an exemplary embodiment of a bandgap circuit and current reference.

FIG. 5 shows an exemplary embodiment of the circuit block 131 for generating the bandgap voltage VBG and the reference current IREF. The circuit block 131 comprises a voltage generation block BG with elements 80-100, a current generation block CO with elements 110-117 and 120-125, a start-up block STU with elements 70-73, and a block PD for controlling a standby state, with elements 60-68 and 118, 126.

In the block BG, the bandgap voltage VBG is generated, wherein a current that is proportional to the absolute temperature, a so-called PTAT current, is used for the generation. This current is generated in the present circuit, for example, by controlling the transistors 94, 95, 96, in the circuit of the transistors 97, 98, the resistor 99 and the transistor 100 connected as a resistor. The PTAT current is mirrored by the transistor 111 in the current generation block CO where it results as a current IPTC with a positive temperature coefficient. In the current generation block CO, a current INTC with a negative temperature coefficient, which can also be referred to as a CTAT current, is additionally generated by the elements 112-117 and 120-125. The components used here are dimensioned such that the temperature coefficients of the currents IPTC, INTC are of essentially the same magnitude and differ only in their sign. At the connection node of the transistors 111, 117, the currents IPTC and INTC are added together to form the temperature-compensated reference current IREF.

At the initial application of an operating voltage at terminal VDD, the voltage generation area BG is securely brought to a desired operating point by the start-up circuit STU. Based on a standby signal pd, the illustrated circuit can be placed in a standby state or a power-saving mode with the circuit parts labelled PD.

Additional possible embodiments of bandgap circuits are generally known and can be used without adaptation in the described oscillator circuit of FIG. 1. It is merely necessary to take care that both generated bandgap voltage VBG and the reference voltage VREF, as well as the reference current IREF, have a low and uniform temperature dependence, to the extent possible.

Figure 6:
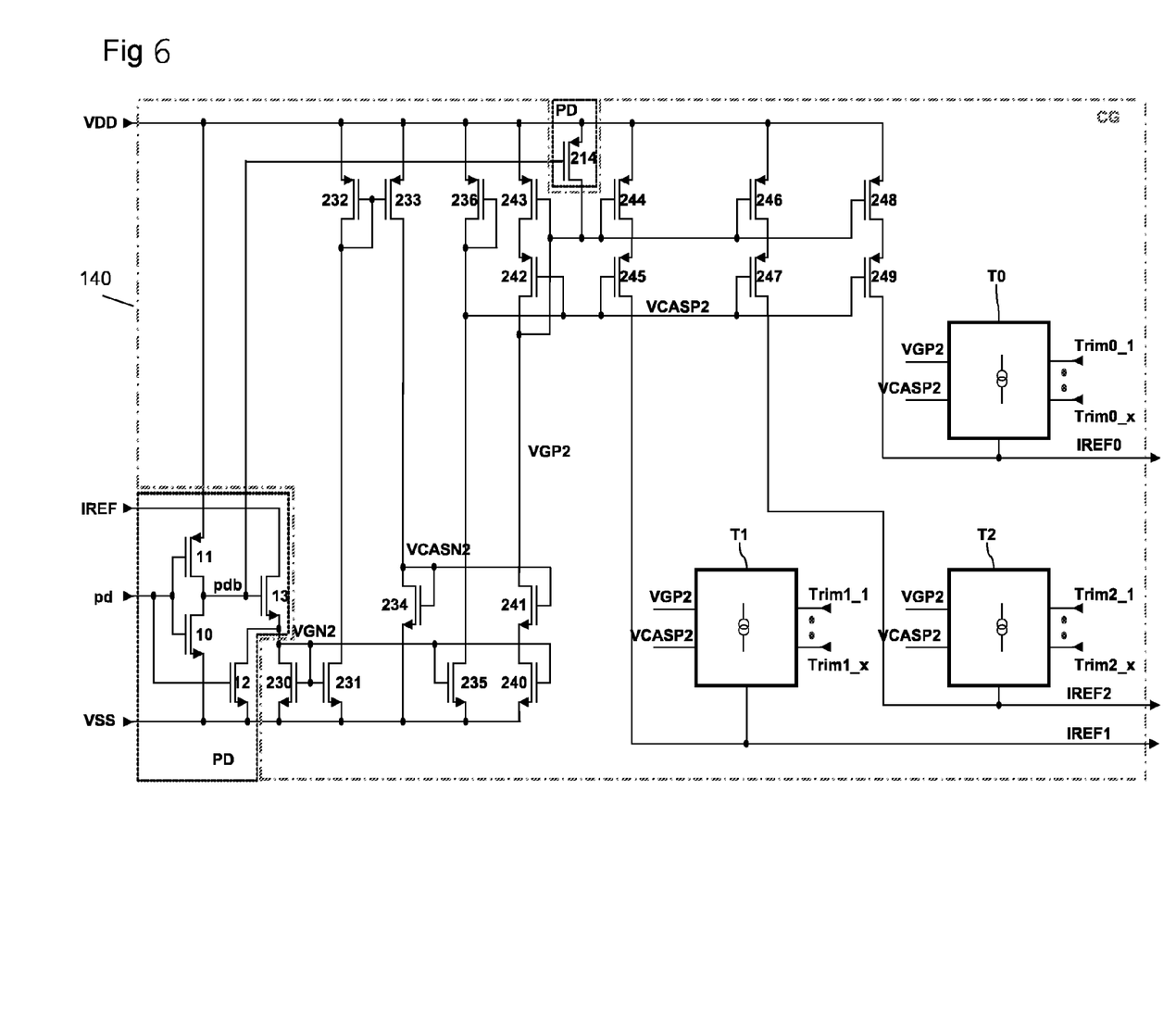
FIG. 6 shows an exemplary embodiment of a trimable load current generator.

FIG. 6 shows an exemplary embodiment of a trimable load current generator 140 with a current generation block CG and a circuit block PD for a standby state. The current generation block CG comprises transistors 230-236 and 240-249, as well as current-trimming circuits T1, T2, T0.

The current generation block CG is fed on the input side, by the reference current IREF, which generates a first cascode voltage VCASN2 via a current mirror 230, 231, an additional current mirror 232, 233 and the transistor 234. A control voltage VGN2, which together with the first cascode voltage VCASN2 generates a first control potential VGP2 via the transistors 235, 240, 241, 242, 243, also results at the control terminal of the current mirror 230, 231. In addition, a second cascode voltage VCASP2, which controls the transistors 245, 247, 249, is generated via the transistors 235, 236 from the first control potential VGP2 and the control voltage VGN2. The first control potential VGP2 additionally drives the transistors 244, 246, 248 jointly such that the reference current IREF ultimately is mirrored via the transistors 242, 243 onto the current paths of the transistors 244, 245, the transistors 246, 247 and the transistors 248, 249. In other words, the transistors 242-249 form a cascaded current mirror.

The trimming circuits T0, T1, T2, to which the signals VGP2 and VCASP2 are supplied on the input side, are connected to the current paths of the transistors 245-249. The trimming circuits T0, T1, T2 comprise, for example, respective controlled current sources which, as a function of trimming signals, emit a respective trimming current that modifies the first and second charging currents IREF1, IREF2, as well as a bias current IREF0. For this purpose, trimming signals TRIM1_1 through TRIM1_X are applied to the first trimming circuit, trimming signals TRIM2_1 through TRIM2_X are applied to the second trimming circuit T2, and trimming signals TRIM0_1 through TRIM0_X are applied to the third trimming circuit T0. The aforementioned trimming signals are applied to trimming inputs TRIM_1, . . . , TRIM_X illustrated in FIG. 1. By means of the trimming signals, for example, linearly or binarily weighted current sources can be switched on or off in the trimming circuits T0, T1, T2, in order thereby to generate an additional defined current that is added to the mirrored currents or subtracted from them.

By means of the circuit block PD, the current generation block CG can be switched to be essentially de-energized based on the standby signal pd and the standby signal pdb generated by the inverter 10, 11.

The invention claimed is:

1. An Oscillator circuit, comprising:
   a switched capacitor circuit comprising a parallel circuit with a current input to be supplied with a reference current on one side and being connected to a reference terminal on the other side, wherein the parallel circuit further comprises a first capacitor in a first branch and, in a second branch, a second capacitor connected in-between a first and second switch, and
   a switch control unit comprising a first input coupled to the current input of the parallel circuit and a second input to be supplied with a reference voltage, and further comprising an oscillator output for providing an oscillator signal, wherein the switch control unit is being designed to operate the first and second switch such that, in a charging phase, the first and the second capacitor are charged in parallel with the reference current to a respective level depending on the reference voltage and, in a discharging phase, the charge stored on the first capacitor is discharged using the charge stored on the second capacitor.

2. The oscillator circuit according to claim 1, further comprising a reference generator to generate the reference current and to generate the reference voltage, wherein
   a reference current output is coupled to the current input of the parallel circuit to supply the reference current, and
   a reference voltage output is coupled to the second input of the switch control unit.

3. The oscillator circuit according to claim 1, wherein the reference generator is a temperature compensated reference generator, in particular a bandgap reference generator.

4. The oscillator circuit according to claim 1, wherein
   the reference current output of the reference generator is connected to an input side of a load current generator and an output side of the load current generator is connected to the current input of the parallel circuit.

5. The oscillator circuit according to claim 4, wherein the load current generator comprises a trimming input to trim the reference current and provide a trimmed reference current at the current input.

6. The oscillator circuit according to claim 1, wherein the first and second capacitors have the same capacity.

7. The oscillator circuit according to claim 1, wherein the switch control unit comprises a comparator comprising the first and second input and comprising an output to provide a control signal.

8. The oscillator circuit according to claim 7, wherein the first input of the comparator is electrically connected to the current input in both charging and discharging phase.

9. The oscillator circuit according to claim 7, wherein the switch control unit comprises a flip-flop further comprising
   a first flip-flop input is connected to the output of the comparator and
   a first flip-flop output is connected to the oscillator output for providing the oscillator signal.

10. The oscillator circuit according to claim 9, wherein the first flip-flop output
    is coupled to the first and second switch and
    outputs a logic signal to operate the first and second switch.

11. The oscillator circuit according to claim 1, comprising a third switch which is grounded and coupled to the second capacitor such that during a reset phase the first and second capacitors are set to a ground potential, and wherein third grounded switch is operated depending on a reset signal.

12. A method for generating an oscillator signal, comprising the steps of:
    generating a reference current and a reference voltage,
    in a charging phase, charging in parallel with the reference current, a first and second capacitor to a respective level depending on the reference voltage,
    in a discharging phase, discharging the charge stored on the first capacitor using the charge stored on the second capacitor, wherein the first capacitor is charged with the reference current during both the charging and discharging phase, and
    generating an oscillator signal depending on the charge stored on the first capacitor.

13. The method for generating an oscillator signal according to claim 12, wherein reference current and a reference voltage are provided in a temperature compensated manner.

14. The method for generating an oscillator signal according to claim 12, wherein
    an oscillation period of the oscillator signal results from succession of a charging phase and discharging phase and
    the oscillator signal is generated by at least one cycle of succeeding charging phase and discharging phase.

* * * * *